United States Patent [19]

Isaacs et al.

[11] 3,994,569
[45] Nov. 30, 1976

[54] TL₃PSE₄ COMPOUND, SINGLE CRYSTALS, AND ACOUSTO-OPTICAL DEVICES

[75] Inventors: Thelma J. Isaacs, Monroeville; Milton S. Gottlieb, Pittsburgh; John D. Feichtner, Murrysville; Andrea A. Price, Pittsburgh, all of Pa.

[73] Assignee: Westinghouse Electric Corporation, Pittsburgh, Pa.

[22] Filed: Sept. 17, 1975

[21] Appl. No.: 614,718

Related U.S. Application Data

[62] Division of Ser. No. 392,693, Aug. 29, 1973, Pat. No. 3,929,970.

[52] U.S. Cl. ............................ 350/161; 331/94.5 M; 252/301.4 P; 252/301.4 F; 330/4.3
[51] Int. Cl.² .......................... H01S 3/10; H01J 1/62
[58] Field of Search ............... 331/94.5 M; 350/161; 252/301.4 P, 301.4 F; 330/4.3

[56] References Cited
UNITED STATES PATENTS
3,746,866 7/1973 Feichtner et al. ............. 331/94.5 M OTHER PUBLICATIONS
Gottlieb et al., Laser Focus, vol. 8, No. 8, Aug. 1972, pp. 24–26.

Primary Examiner—Robert J. Webster
Attorney, Agent, or Firm—R. D. Fuerle

[57] ABSTRACT

The compound Tl₃PSe₄ is disclosed. Non-conducting single crystals of the compound are prepared which have outstanding acousto-optical properties including an exceptionally high acousto-optical figure of merit. The crystals are used in various acousto-optical devices including a display device, a laser modulator, a non-collinear acousto-optical filter, and an acoustic delay line.

24 Claims, 5 Drawing Figures

TL₃PSE₄ COMPOUND, SINGLE CRYSTALS, AND ACOUSTO-OPTICAL DEVICES

This is a division of application Ser. No. 392,693 filed Aug. 29, 1973 U.S. Pat. No. 3,929,970.

CROSS-REFERENCE TO RELATED APPLICATIONS

This application is related to application Ser. No. 242,986 filed Apr. 11, 1972, entitled "Tl₃AsS₄ Crystals And Acousto-Optical Systems," now U.S. Pat. No. 3,799,659.

This application is related to application Ser. No. 392,695, filed Aug. 29, 1973 by T. J. Isaacs et al. titled "Tl₃VS₄ and Tl₃NbS₄ Crystals and Acousto-Optical Devices."

This application is related to application Ser. No. 540,192 filed Jan. 10, 1975 by T. J. Isaacs et al. titled "Tl₃TaS₄ and Tl₃TaSe₄ Crystals and Acousto-Optical Devices."

BACKGROUND OF THE INVENTION

In 1932 Brillouin discovered that high frequency sound waves can cause diffraction of light. With the advent of the laser and advances in high frequency acoustic techniques many applications for this phenomenon have been found such as display devices or laser modulators.

A sound wave moving in crystal is composed of alternating compression and rarefaction fronts. The indices of refraction in these fronts are different, so that the crystal acts as a diffraction grating, diffracting light which passes through it, the angle of diffraction increasing as the frequency of the sound wave increases, and the amount of light diffracted increasing with the intensity of the sound wave.

There are two modes of diffraction, the Debye-Sears mode and the Bragg mode. The Debye-Sears mode is obtained if the width of the acoustic beam is less than about $\Lambda^2/(4\lambda)$ and the Bragg mode is obtained if the width of the acoustic beam is greater than about $\Lambda^2/(4\lambda)$ where $\Lambda$ is the acoustic wavelength and $\lambda$ is the light wavelength. In both modes the acoustic wavelength $\Lambda$ must be greater than the light wavelength $\lambda$, and $\lambda$ must be within the transparency region of the crystal. In the Debye-Sears mode light enters the crystal parallel to the acoustic wave fronts (0° diffracting angle) and is multiply-diffracted into many images or orders of the initial light beam. In the Bragg mode light enters the crystal at the Bragg angle $\phi$ to the acoustic wave fronts where $\sin \phi = \lambda/\Lambda$. In this mode the acoustic wavelength and the Bragg angle are matched to the particular light wavelength, and a single image is diffracted from the crystal at the Bragg angle $\phi$ to the acoustic wave fronts.

A good acousto-optical material should have a high figure of merit, $M_2$, a measurement of the amount of light diffracted for a given amount of acoustic power, where $M_2 = n^6 p^2/\rho v^3$ and $n$ is a refractive index, $p$ is the photo-elastic coefficient, $\rho$ is the density, and $v$ is the acoustic velocity. As the formula indicates, a low velocity will give a high figure of merit and, in addition, it will give a greater delay per unit length if the crystal is used in a delay line thus permitting acoustic signal processing devices to have smaller physical dimensions. A good acousto-optical material should also have a low acoustic attenuation, allowing a high frequency wave to propagate a long distance before it is absorbed.

The following table gives a few of the properties of the best acousto-optical materials currently known for use in the near infrared region of the spectrum.

| Material | Optical Transmission Range (m) | Acoustic Velocity ($\times 10^5$ cm/sec) | Fig. of Merit |
|---|---|---|---|
| Ge | 2–20 | 5.5 | 525 |
| As₂S₃ glass | 0.9–11 | 2.6 | 230 |
| GaAs | 1–11 | 5.15 | 93 |
| Tl₃AsS₄ | 0.6–12 | 2.15 | 330 |
| PbMoO₄ | 0.4–5.5 | 3.83 | 24 |

PRIOR ART

An article entitled "Some Ternary Thallium Chalcogenides" by C. Crevecoeur appears in the January-June 1964 volume (No. 17) of Acta Crystallographica on page 757. That article describes the preparation and characteristics of the isomophous compounds Tl₃VS₄, Tl₃NbS₄, Tl₃TaS₄, Tl₃VSe₄, Tl₃NbSe₄, and Tl₃TaSe₄.

SUMMARY OF THE INVENTION

We have discovered the existence of the compound Tl₃PSe₄, and have found that large single crystals can be grown from this compound. We have also found that crystals of Tl₃PSe₄ have the highest acousto-optical figure of merit and lowest acoustic velocity of any known material, and that acousto-optical devices employing these crystals have outstanding properties. The crystals also have good physical properties such as resistance to moisture, they can be grown to large sizes, and they have low acoustic velocities and acoustic attenuation.

DESCRIPTION OF THE INVENTION

PREPARATION OF THE COMPOUND AND CRYSTAL

Figure 1:
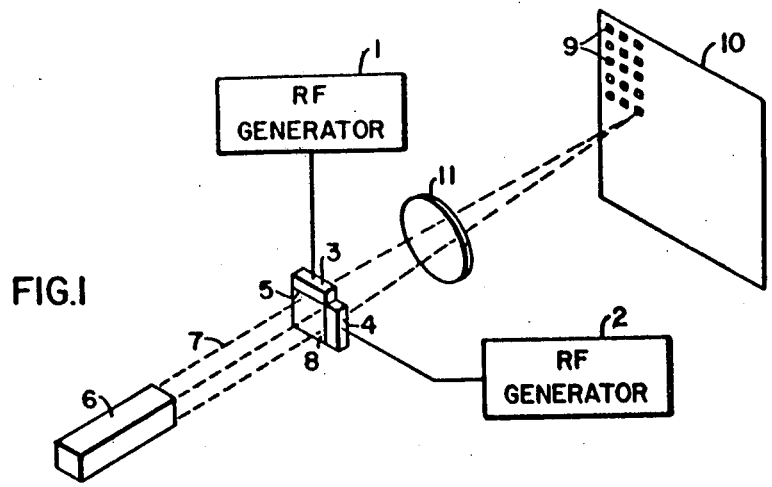
FIG. 1 is an isometric diagrammatic drawing of a display device.

The compound of this invention, Tl₃PSe₄, may be prepared by mixing together very pure stoichiometric quantities of the elements involved and melting them together until they have reacted to form the compound. The compound and the resulting crystal may be made slightly non-stoichiometric in order to relieve internal stresses. Up to about 50% of the phosphorus may be substituted for with arsenic.

The crystal may be prepared by the Stockbarger technique in which the compound is sealed in a quartz tube under argon, melted, and lowered very slowly (10 to 15 mm/day) through a two-zone furnace having a steep temperature gradient (8° to 12° C/mm) at the melting point of the compound. The compound melts congruently at approximately 436° C ± 10° C.

THE CRYSTAL

The crystal of this invention is biaxial, non-piezoelectric, and orthorhombic. Its space group is Pcmn, its Laue class is mmm, and the diffraction aspect derived from X-ray data is *Pcn*. The length of the axes of the crystal are about $a=9.270A$, $b=11.047A$, $c=9.059A$, and its transparency region is about 0.78 $\mu$m to about 17 $\mu$m, although strong absorption peaks exist at 9.53 $\mu$m, 9.76 $\mu$m, from 11.4 $\mu$m to 12.5 $\mu$m, and from 15.6 $\mu$m to 16.1 $\mu$m.

The crystals should be as long as possible in order to maximize the output power, but if the crystal is too thick (i.e., more than about 10 cm) light loss due to absorption will be high. On the other hand, the crystal should not be too thin in the direction of light propagation as this will result in poor interaction between the light and sound and therefore a low intensity defraction, but a crystal as small as 1 mm long can be optically useful. From the practical point of view of orienting and polishing faces on the crystal and attaching to it a transducer to generate acoustic waves, the crystal must have dimensions of at least 0.1 mm. The width of the crystal should be at least as wide as the input beam can be focused, about $10^{-3}$mm, so that the light is not wasted. For acousto-optical applications, the crystal must be large enough to produce a Bragg interaction between sound and light. That requires at least 10 acoustic wave fronts, which means a minimum length of about $2\times10^{-3}$mm is required at an acoustic frequency of 300 MHz. Preferably the crystal should be at least about 0.05 cm in diameter and about 1 cm long to have practical usefulness in most applications. The crystal also preferably has at least two polished parallel optical faces, which preferably are perpendicular to those axes of the crystal along which sound propagates as a pure longitudinal or shear mode.

THE SOUND WAVES

The sound wave may be a longitudinal wave, where the particle motion is in the direction of propagation of the wave, or it may be a shear wave, where the particle motion is perpendicular to the propagation direction of the wave, or it may be a combination of both. Preferably, it is either pure shear or pure longitudinal because the two waves travel at different velocities and quickly become out of phase. For delay line applications shear waves are desirable because of their lower velocity. Pure shear waves are obtained by propagating the wave in a pure shear direction (determined from the crystal symmetry) using a shear wave generating transducer such as a Y-cut or A–C cut quartz, which is glued to the crystal. Longitudinal waves are obtained by propagating the wave along the c-axis or another pure longitudinal direction using a longitudinal wave generating transducer such as X-cut quartz which is glued to the crystal.

DISPLAY DEVICES

In a display device a light beam is directed at the crystal and the deflected beam which leaves the crystal is directed at some type of viewing screen.

In FIG. 1 RF generators 1 and 2 send RF signals to transducers 3 and 4 respectively which respectively generate vertically moving and horizontally moving sound waves in crystal 5, preferably in the Bragg mode so that there is only one diffracted beam. The light, which is preferably parallel and polarized for good resolution, is obtained from laser 6 which generates a coherent beam of light 7 directed at one of the two parallel optical faces 8 of crystal 5. Light passing through crystal 5 is directed at various spots 9 on viewing screen 10 by means of the vertically and horizontally moving sound waves generated by transducers 3 and 4. Lens 11 focuses the light at the spot.

The illuminated spots may each be a page of information which is then optically enlarged and projected on a second viewing screen (not shown). The illuminated spots could also in themselves form a pattern. For example, viewing screen 10 could be an infrared-sensitive phosphor coated screen such as zinc sulfide doped with lead and copper and flooded with UV light and the successive illumination of selected spots would form a picture similar to a TV picture. Or, viewing screen 10 could be infrared or thermally quenched UV-excited phosphor screen where ultraviolet light causes the entire screen to be illuminated, but each selected spot successively struck by the beam from crystal 5 is darkened to form a picture on the screen.

LASER MODULATOR

In a laser modulator the acousto-optical system modulates a portion of the output of the lasing medium. If the light is focused to less than about $10^{-2}$ or $10^{-3}$ cm it will be modulated but not diffracted. For greater diameter focal spots it will be both diffracted and modulated. A laser modulator could be used, for example, to send signals by means of the fluctuating laser beam intensity.

Figure 2:
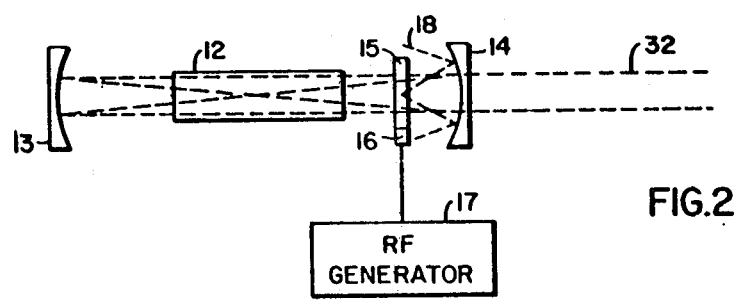
FIG. 2 is a diagrammatic drawing of a laser modulator of the internal configuration.

FIG. 2 shows a laser modulator of the internal configuration. In FIG. 2, lasing medium 12 produces a beam of coherent light which is multiply-reflected between mirrors 13 and 14. Mirror 13 totally reflects the light and mirror mirror 14 partially reflects it and partially transmits it as the laser output 32. Interposed between lasing medium 12 andmirror 14 is a crystal 15 of $Tl_3PSe_4$. (The crystal could also be positioned between mirror 13 and the lasing medium). To crystal 15 is affixed a transducer 16 which is electrically connected to an RF generator 17. This generator produces a radio-frequency electrical signal which transducer 16 converts into an acoustic wave which moves through crystal 15 diffracting light as shown at 18.

Figure 3:
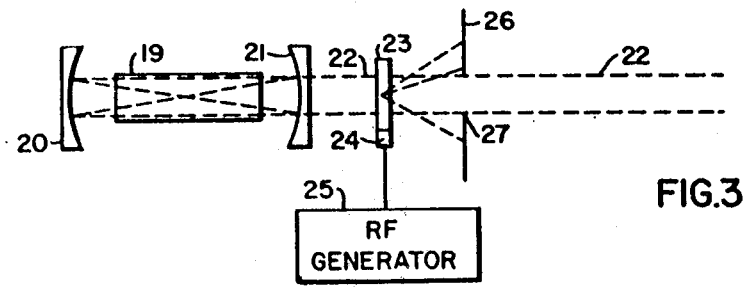
FIG. 3 is a diagrammatic drawing of a laser modulator of the external configuration.

FIG. 3 shows a laser modulator of the external configuration. In FIG. 3 lasing medium 19 produces a beam of coherent light which is multiply-reflected between mirror 20, which totally reflects the beam, and mirror 21 which partially reflects the beam and partially transmits it as laser output 22. The laser output 22 strikes crystal 23 of $Tl_3PSe_4$ to which is affixed transducer 24 electrically connected to RF generator 25. Generating a sound wave in the crystal diffracts the laser output causing it to strike screen 26 instead of passing through aperture 27 in the screen.

ACOUSTIC DELAY LINE

An acoustic delay line causes an electrical signal to be delayed for the length of time required for an acoustic signal to traverse the crystal, L/V, where L is the length of the crystal and V is the acoustic velocity. Unlike many other methods of delaying an electrical signal, an acoustic delay line preserves the original configuration of the signal.

Figure 4:
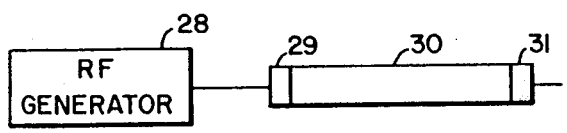
FIG. 4 is a diagrammatic drawing of an acoustic delay line.
Figure 5:
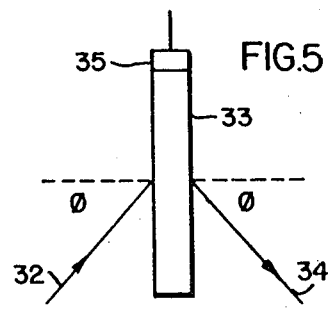
FIG. 5 is a diagrammatic drawing of a non-collinear acousto-optical filter.

In FIG. 4, RF generator 28 provides the electrical signal to be delayed. This signal is electrically transmitted to transducer 29 which converts the signal to an acoustic wave which is propagated through crystal 30 of Tl₃PSe₄. At the other end of the crystal transducer 31 detects the acoustic wave and converts it into an electrical signal.

NON-COLLINEAR FILTER

In a non-collinear filter, the incident light 32 strikes the crystal 33 at a fixed angle, $\phi$. Only light of wavelength $\lambda$, which satisfies the condition $$\lambda = v/f \sin \phi$$

will be diffracted at the angle $\phi$ into the output beams 34; $f$ is the frequency applied to the transducer 35. Light of any other wavelength passes through the crystal undeflected. Any wavelength of light may be selected for deflection by choosing the appropriate frequency.

EXAMPLE

A reaction vessel was charged with 6.1311 grams thallium, 0.3097 grams phosphorus, and 3.1584 grams selenium. The vessel was sealed under vacuum and heated at about 800° C for 1 day. It was shaken vigorously a number of times for thorough mixing in order to produce the compound Tl₃PSe₄.

The reactant was placed in a fused quartz crystal growing tube 0.8 centimeters in diameter and covered with argon at a pressure of 15 inches. Using the Stockbarger technique, crystal Tl₃PSe₄ was grown from the melt at a rate of 13.5 millimeters/day. The crystal was cut perpendicular to the axes to form a cube about 0.6 cm. on a side.

The refractive indices of the crystal were measured in a method of normal incidence, using a spectrometer with a chopped tungsten source. Wavelength selection was accomplished with narrow band interference filters, and detection of the deflected beam was by a photo-multiplier for the 0.8 $\mu$m to 1.15 $\mu$m region, and by liquid nitrogen cooled InSb photo-voltail detector for wavelength of the region 1.2 $\mu$m to 5.3 $\mu$m. The following table gives the results of the refractive index measurements.

| Wavelength ($\mu$m) | Refractive Indices | | |
|---|---|---|---|
| | $n_a$ | $n_b$ | $n_c$ |
| 0.749 | 3.088 | 3.027 | 3.056 |
| 0.825 | 3.028 | 2.967 | 3.000 |
| 1.06 | 2.933 | 2.870 | 2.904 |
| 1.15 | 2.916 | 2.857 | 2.883 |
| 1.553 | 2.865 | 2.807 | 2.839 |
| 2.66 | 2.834 | 2.773 | 2.808 |
| 3.29 | 2.826 | 2.768 | 2.799 |
| 3.365 | 2.825 | 2.765 | 2.798 |
| 3.38 | 2.824 | 2.765 | 2.798 |
| 4.35 | 2.820 | 2.760 | 2.795 |
| 4.46 | 2.817 | 2.758 | 2.792 |
| 5.26 | 2.815 | 2.756 | 2.791 |

($n_a$ is refractive index for light polarized $\perp$ to the $a$-axis, where $a$, $b$, and $c$ are the crystallographically defined axes such that $a = 9.270$ A, $b = 11.047$ A, $c = 9.059$ A).

The acoustic properties of the crystal were measured on a sample of crystal approximately 0.5 centimeters on the side. Transducers were cemented on each part of opposite faces of the crystal, and the velocities were measured by the conventional pulse-echo method. The longitudinal wave velocity for propagation along the $c$-axis was 2.22 × 10⁵ cm/sec, and along the $a$- and $b$-axes it was 1.98 × 10⁵ cm/sec. There was a fast shear wave for propagation along each of the three axes, of velocity 1.1 × 10⁵ cm/sec. For propagation along the $c$-direction and the $a$-direction there is also a slow shear wave of velocity 5.05 × 10⁴ cm/sec.

The acousto-optic figure of merit at $\lambda = 1.15$ $\mu$m, relative to fused quartz was measured for various configurations. For longitudinal waves, this relative figure of merit ranged from 500 to 1365, and for shear waves, it reached a measured value of 1370.

We claim:

1. A method of diffracting light comprising passing said light through a single crystal having the general formula Tl₃ X Se₄ where X is about 50 to about 100% phosphorus and about 0 to about 50% arsenic, while generating a sound wave at a diffracting angle to said light in said single crystal.

2. A method according to claim 1 wherein said single crystal is at least about 0.05 centimeters in diameter and at least about 1 centimeter long.

3. A method according to claim 1 wherein said single crystal has two parallel optical faces.

4. A method according to claim 1 wherein two sound waves are generated perpendicular to each other, and including the last step of directing said diffracted light at a viewing screen.

5. A method according to claim 4 wherein said sound waves are in the Bragg mode.

6. A method according to claim 4 wherein said light is polarized and coherent.

7. A method according to claim 4 wherein the source of said light is a laser which comprises a lasing medium positioned between two opposing mirrors, one partially reflecting and the other totally reflecting.

8. A method according to claim 7 wherein said single crystal is positioned external to said laser.

9. A method according to claim 7 wherein said single crystal is positioned between said lasing medium and one of said mirrors.

10. A method according to claim 1 wherein said single crystal is a rectangle, said sound waves move the length of said rectangle, and said light wave is incident to the face of said rectangle at a non-normal angle.

11. A method according to claim 1 wherein said single crystal has the formula Tl₃PSe₄.

12. An acousto-optical system comprising:
   1. a single crystal having the general formula Tl₃ X Se₄ where X is about 50 to about 100% phosphorus and about 0 to about 50% arsenic;
   2. means for passing light through said crystal;
   3. means for generating a sound wave at a diffracting angle to said light in said crystal; and
   4. means for detecting said light after it passes through said crystal.

13. An acousto-optical system according to claim 12 wherein said single crystal is at least about 0.05 centimeters in diameter and at least about 1 centimeter long.

14. An acousto-optical system according to claim 12 wherein said single crystal has two parallel optical faces.

15. An acousto-optical system according to claim 12 including means for generating a second sound wave perpendicular to the first sound wave, and including a viewing screen which is irradiated by said diffracted light.

16. An acousto-optical system according to claim 15 wherein said sound waves are in the Bragg mode.

17. An acousto-optical system according to claim 15 wherein said light is polarized and coherent.

18. An acousto-optical system according to claim 12 wherein the source of said light is a laser which comprises a lasing medium positioned between two opposing mirrors, one partially reflecting and the other totally reflecting.

19. An acousto-optical system according to claim 18 wherein said single crystal is positioned external to said laser.

20. An acousto-optical system according to claim 18 wherein said single crystal is positioned between said lasing medium and one of said mirrors.

21. An acousto-optical system according to claim 12 wherein said single crystal is a rectangle, said means for generating said sound wave generates said sound wave along the length of said rectangle, and said light wave is incident to the face of said rectangle at a non-normal angle.

22. An acousto-optical system according to claim 12 wherein said single crystal has the general formula $Tl_3PSe_4$.

23. An acoustic delay line comprising:
   1. a single crystal having the general formula $Tl_3XSe_4$ where X is about 50 to about 100% phosphorus and about 0 to about 50% arsenic;
   2. means for generating sound waves in said crystal; and
   3. means for detecting said sound waves after they have traversed said crystal.

24. An acoustic delay line according to claim 23 wherein said single crystal has the general formula $Tl_3PSe_4$.

* * * * *